(12) United States Patent
Lee

(10) Patent No.: US 9,947,726 B2
(45) Date of Patent: Apr. 17, 2018

(54) FOLDABLE DISPLAY

(71) Applicant: SAMSUNG DISPLAY CO., LTD., Yongin-si, Gyeonggi-do (KR)

(72) Inventor: Sang Wol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/058,006

(22) Filed: Mar. 1, 2016

(65) Prior Publication Data

US 2016/0380033 A1 Dec. 29, 2016

(30) Foreign Application Priority Data

Jun. 25, 2015 (KR) .................. 10-2015-0090664

(51) Int. Cl.
| | | |
|---|---|---|
| *H05K 7/00* | (2006.01) | |
| *H05K 5/02* | (2006.01) | |
| *G06F 1/16* | (2006.01) | |
| *H01L 51/52* | (2006.01) | |
| *H01L 27/32* | (2006.01) | |
| *G06F 3/041* | (2006.01) | |

(52) U.S. Cl.
CPC ............. *H01L 27/323* (2013.01); *G06F 1/16* (2013.01); *G06F 1/1652* (2013.01); *G06F 3/0412* (2013.01); *H01L 51/524* (2013.01); *H01L 51/5237* (2013.01); *H01L 51/5253* (2013.01); *H01L 51/5281* (2013.01); *H05K 5/02* (2013.01); *H05K 7/00* (2013.01); *G06F 2203/04102* (2013.01); *H01L 27/3244* (2013.01); *H01L 2251/5338* (2013.01)

(58) Field of Classification Search
CPC ..... H01L 27/323; H01L 27/32; H01L 29/786; H01L 51/5237; H01L 51/524; H01L 51/5253; H01L 51/5281; H01L 51/00; H01L 51/56; G06F 3/0412; G06F 1/16; G06F 1/1652; H05K 7/00; H05K 5/02
USPC ...... 257/40, 66; 361/679.01, 679.26, 679.27, 361/749; 362/97.1; 438/23
See application file for complete search history.

(56) References Cited

U.S. PATENT DOCUMENTS

| | | | | |
|---|---|---|---|---|
| 9,348,450 | B1 * | 5/2016 | Kim ...................... | G06F 3/0412 |
| 2012/0002360 | A1 * | 1/2012 | Seo ....................... | G06F 1/1616 |
| | | | | 361/679.01 |
| 2012/0314399 | A1 * | 12/2012 | Bohn ..................... | G06F 1/1616 |
| | | | | 362/97.1 |
| 2013/0050961 | A1 * | 2/2013 | Kang .................... | H04M 1/0216 |
| | | | | 361/749 |

(Continued)

FOREIGN PATENT DOCUMENTS

| | | |
|---|---|---|
| KR | 10-2009-0082953 A | 8/2009 |
| KR | 10-2010-0137143 A | 12/2010 |

(Continued)

*Primary Examiner* — Dao H Nguyen
(74) *Attorney, Agent, or Firm* — Lewis Roca Rothgerber Christie LLP

(57) ABSTRACT

A foldable display device according to one or more exemplary embodiments of the present invention includes: a first supporting member; a second supporting member coupled to the first supporting member and configured to be rotated with respect to the first supporting member; an ultra-elastic sheet adhered to the first supporting member and the second supporting member; and a display module adhered to the ultra-elastic sheet.

19 Claims, 8 Drawing Sheets

(56) References Cited

U.S. PATENT DOCUMENTS

2014/0362513 A1 12/2014 Nurmi
2015/0257289 A1* 9/2015 Lee ..................... H05K 5/0017
　　　　　　　　　　　　　　　　　　　361/749
2015/0257290 A1* 9/2015 Lee ..................... H04M 1/0216
　　　　　　　　　　　　　　　　　　　361/749

FOREIGN PATENT DOCUMENTS

KR　　10-2012-0002084 A　　1/2012
KR　　　10-1404628 B1　　6/2014

* cited by examiner

FOLDABLE DISPLAY

CROSS REFERENCE TO RELATED APPLICATION

This application claims priority to, and the benefit of, Korean Patent Application No. 10-2015-0090664, filed in the Korean Intellectual Property Office on Jun. 25, 2015, the entire contents of which are incorporated herein by reference.

BACKGROUND

1. Field

The described technology relates generally to a foldable display device.

2. Description of the Related Art

Examples of currently popular flat panel displays include a liquid crystal display (LCD), a plasma display panel (PDP), an organic light emitting device (OLED), an electric field effect display (FED), and an electrophoretic display (EPD).

In a display device, generally, layers such as a display panel including a thin film transistor and an emission layer, a polarization film on the display panel, and a touch screen panel (TSP) are laminated. At the outermost portion of the display device, the layers, such as the display panel, the polarization film, and the touch screen panel, are encapsulated by using a transparent window to prevent moisture or oxygen from penetrating from the outside.

Particularly, in the case of a foldable display device, a flexible display panel is utilized, and each of the layers is adhered by a pressure sensitive adhesive (PSA), and each layer has a natural folding shape due to a tensile limitation of a material thereof. Also, when being assembled to the display device having a set shape, the natural folding shape must be forced to fit the set shape.

As shown in FIG. 7 and FIG. 8, after mounting a display module 2, which includes a window layer 2-1 adhered to a display panel 2-3 and a lower film 2-4 by an adhesive 2-2, to a folding evaluation jig 1, when folding the display module 2 with respect to a rotation axis of the jig 1, an actual tensile stress that is applied to the window layer 2-1 is less than a required tensile stress, and an actual compression stress that is applied to the lower film 2-4 is greater than a required compression stress. As such, the compression stress that is applied to the side of the lower film 2-4 increases, and the lower film 2-4 adhered by the adhesive 2-2 receives a large degree of the compression stress, such that the layer of interlayer adhesion may fail and cause separation, such that a defect such as buckling or peeling is generated.

The above information disclosed in this Background section is only for enhancement of understanding of the background of the described technology and therefore it may contain information that does not form the prior art.

SUMMARY

One or more embodiments of the present invention include an ultra-elastic sheet adhered under a display panel of a foldable display module to prevent (or reduce the likelihood of) layers of the display module from peeling when folding the display device.

A foldable display device according to one or more exemplary embodiments of the present invention includes: a first supporting member; a second supporting member coupled to the first supporting member and configured to be rotated with respect to the first supporting member; an ultra-elastic sheet adhered to the first supporting member and the second supporting member; and a display module adhered to the ultra-elastic sheet.

The ultra-elastic sheet may comprise a metal sheet or INVAR®.

The ultra-elastic sheet may have a modulus of elasticity of about 50 GPa to about 80 GPa.

An end of the second supporting member may be coupled to an end of the first supporting member by a hinge axis.

The display module may include: a display panel; a touch screen panel on the display panel; and a window layer on the touch screen panel.

The display panel may include a flexible display substrate; a display element layer on the flexible display substrate and including a plurality of pixels; and a thin film encapsulation layer covering the flexible display substrate and the display element layer.

The display element layer may include an organic light emission display element.

The window layer may include polyimide (PI) and/or polyethylene terephthalate (PET).

The display module may further include a polarization film between the display panel and the touch screen panel.

The foldable display device may further include a mechanical bracket adhered to the first supporting member and a second region of the second supporting member, and the ultra-elastic sheet may be adhered to the first supporting member and a first region of the second supporting member.

According to the foldable display device according to one or more embodiments of the present invention, when folding the display device, the layers of the display module may be prevented from being peeled, or the likelihood thereof may be reduced, and the mechanical strength of the display device may be improved.

DETAILED DESCRIPTION

Figure 1:
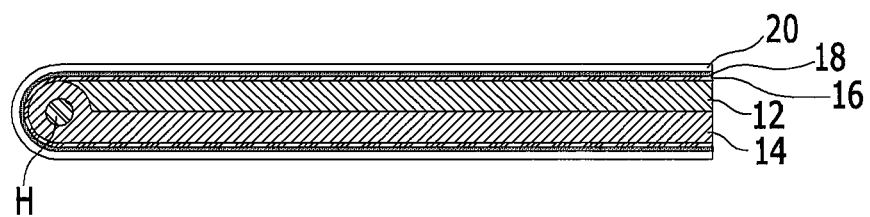
FIG. 1 is a cross-sectional view of a foldable display device according to one or more exemplary embodiments of the present invention.

Embodiments of the present invention are described more fully hereinafter with reference to the accompanying drawings, in which exemplary embodiments of the invention are shown. As those skilled in the art would realize, the described embodiments may be modified in various different ways, all without departing from the spirit or scope of the present invention. Accordingly, processes, elements, and techniques that are not necessary to those having ordinary skill in the art for a complete understanding of the aspects and features of the present invention may not be described. For example, the exemplary embodiments are not limited to a specific aspect of the illustrated region, and for example, may include modification of an aspect by manufacturing. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a foldable display device according to one or more exemplary embodiments of the present invention is described with reference to FIG. 1 to FIG. 3.

Figure 2:
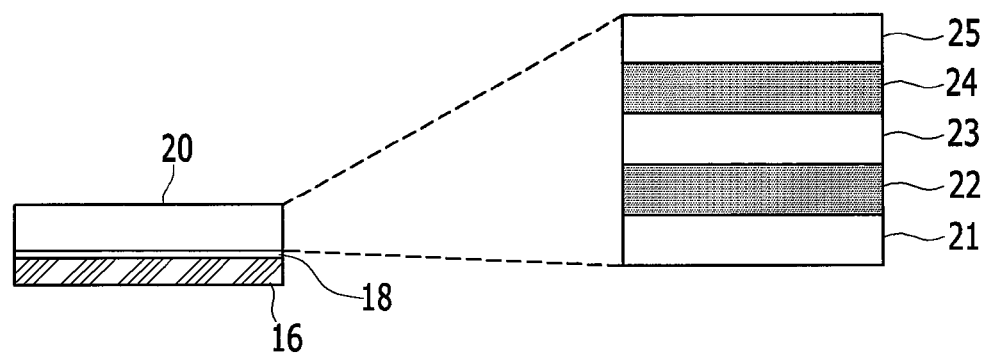
FIG. 2 is a cross-sectional view showing one example of a lamination structure of a display module of the foldable display device shown in FIG. 1.
Figure 3:
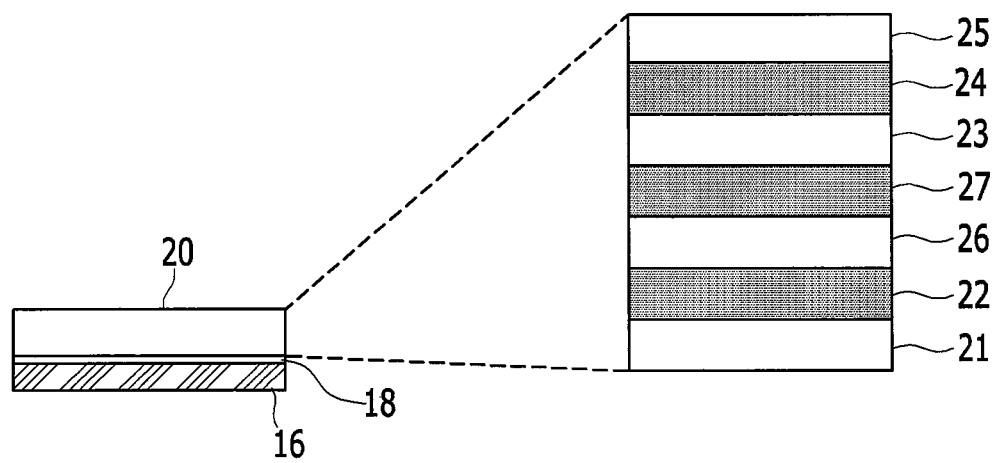
FIG. 3 is a cross-sectional view showing another example of a lamination structure of a display module of the foldable display device shown in FIG. 1.

FIG. 1 is a cross-sectional view of a foldable display device according to one or more exemplary embodiments of the present invention, FIG. 2 is a cross-sectional view showing an example of a lamination structure of a display module of the foldable display device shown in FIG. 1, and FIG. 3 is a cross-sectional view showing another example of a lamination structure of the display module of the foldable display device shown in FIG. 1.

Referring to FIG. 1, in some embodiments of the present invention, the foldable display device includes a first supporting member 12 and a second supporting member 14 coupled to the first supporting member 12 to be rotated with respect to the first supporting member 12. An ultra-elastic sheet 16 is adhered to the first supporting member 12 and to the second supporting member 14. The first supporting member 12 and the second supporting member 14 may be coupled by a hinge axis H to be rotated thereabout. The ultra-elastic sheet 16 may be adhered to an entire region where the first supporting member 12 and the second supporting member 14 are coupled and rotated. The ultra-elastic sheet 16 may be formed of a metal sheet or INVAR® (INVAR® is a registered trademark of Aperam Alloys Imphy Joint Stock Company, Saint-Denis, France), for example, and may have an elastic modulus of about 50 GPa to about 80 GPa.

The display module 20 is adhered to the ultra-elastic sheet 16 by an adhesive (e.g., an adhesive tape or a pressure sensitive adhesive) 18. When the first supporting member 12 and the second supporting member 14 are rotated to be unfolded, the ultra-elastic sheet 16 and the display module 20 that are adhered to the first supporting member 12 and the second supporting member 14 are also unfolded. Referring to FIG. 2, the display module 20 includes a display panel 21, a touch screen panel 23 on the display panel 21, and a window layer 25 on the touch screen panel 23. The display panel 21, the touch screen panel 23, and the window layer 25 are adhered to each other by pressure sensitive adhesives 22 and 24. The window layer 25 may be adhered to the touch screen panel 23 by an optically clear adhesive (OCA). The ultra-elastic sheet 16 is adhered under the display module 20 by the adhesive 18.

As shown in FIG. 3, in some embodiments, the display module 20 may further include a polarization film 26 between the display panel 21 and the touch screen panel 23 (e.g., the polarization film 26 may be adhered to the touch screen panel 23 by an adhesive 27). The polarization film 26 may have a flexible characteristic, and may simultaneously reduce thickness and improve visibility of the image.

In some embodiments, a phase retardation film may be further included between the display panel 21 and the window layer 25. The phase delay film may be a A/4 phase delay film, and circularly polarizes linearly polarized light or linearly polarizes circularly polarized light. The phase delay film may include a birefringence film, which may be made by performing stretching treatment on a film made of suitable polymers, such as polycarbonate or polyvinyl alcohol, polystyrene or polymethyl methacrylate, polypropylene or another polyolefin, and polyarylate or polyamide, an oriented film of a liquid crystal polymer, a film supporting an oriented layer of a liquid crystal polymer, and the like. Further, the phase delay film may be made of a ZEONOR® brand resin (ZEONOR® is a registered trademark of Zeon Corporation, Tokyo, Japan) or ARTON® brand resin (ARTON® is a registered trademark of JSR Corporation, Tokyo, Japan).

In some embodiments, the display panel 21 may include a flexible display substrate, a display element layer, and a thin film encapsulation layer. The display element layer may be formed on the flexible display substrate, may include a plurality of pixels, and the thin film encapsulation layer may cover the display substrate and the display element layer to prevent, or reduce the likelihood of, oxygen or moisture from entering (or contacting or flowing into) the display element layer from the outside.

The flexible display substrate may be made of a flexible plastic material, although the present invention is not limited thereto, and the flexible substrate may be formed of a metallic substrate made of stainless steel, or various other flexible materials, for example.

The display element layer is formed on the display substrate, and includes an element region where an active element, such as a thin film transistor (TFT), is formed, and includes an emission region where an emission layer is formed. The element region and the emission region may be positioned to be separated or to be overlapped. The display element layer may include an organic light emission display element.

At least one or more organic film layers and at least one or more inorganic film layers may be layered, while being alternately arranged, in the thin film encapsulation layer. The uppermost layer (or outer layer) of the thin film encapsulation layer may be formed of the inorganic layer to prevent (or substantially prevent) moisture from penetrating the display element layer.

In some embodiments, the window layer 25 may be a plastic substrate formed of polyimide (PI) and/or polyethylene terephthalate (PET).

Hereinafter, a foldable display device according to one or more exemplary embodiments of the present invention is described with reference to FIG. 4 to FIG. 6.

Figure 4:
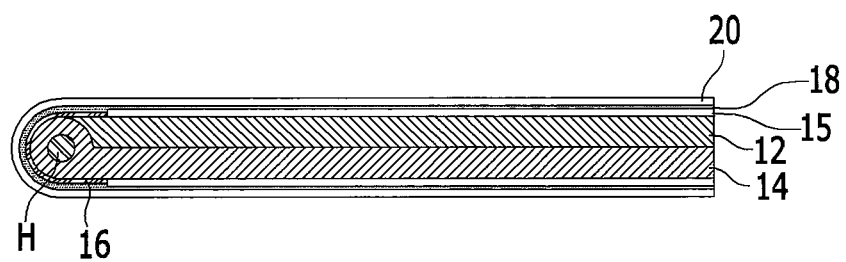
FIG. 4 is a cross-sectional view of a foldable display device according to one or more exemplary embodiments of the present invention.
Figure 5:
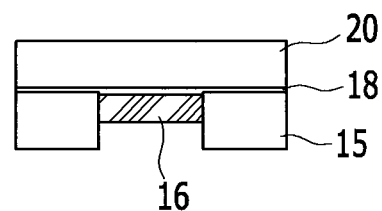
FIG. 5 is a schematic cross-sectional view of the foldable display device shown in FIG. 4.
Figure 6:
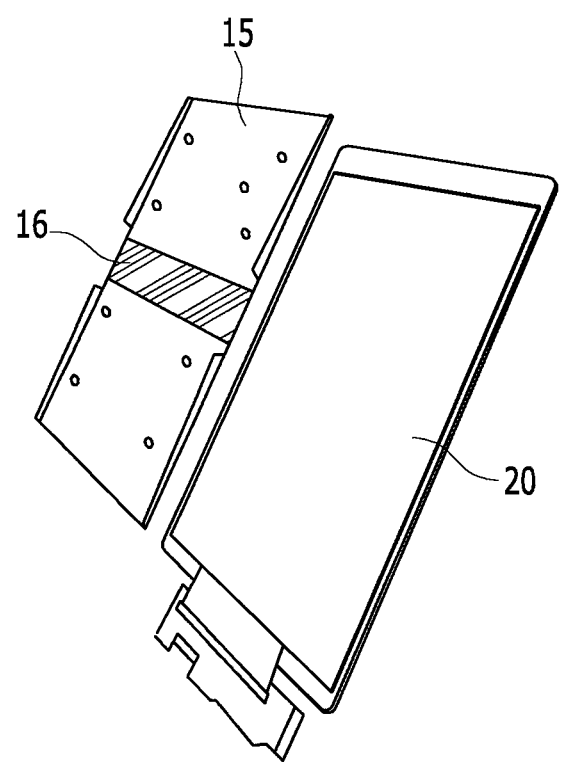
FIG. 6 is a perspective view of the foldable display device shown in FIG. 4.
Figure 7:
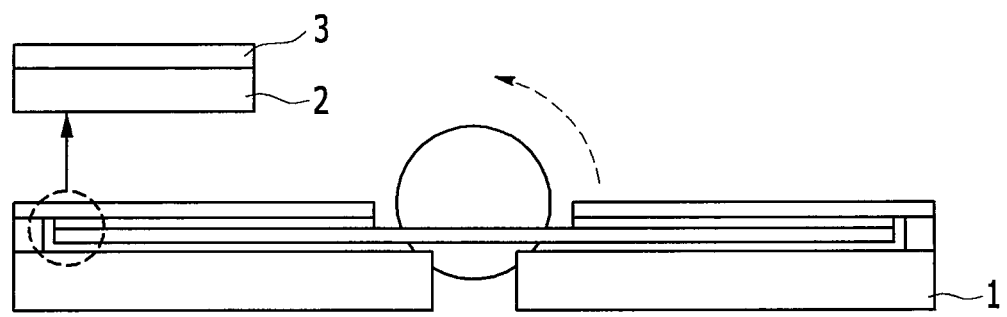
FIG. 7 is a schematic view showing execution of a folding evaluation shape of a conventional foldable display module.
Figure 8:
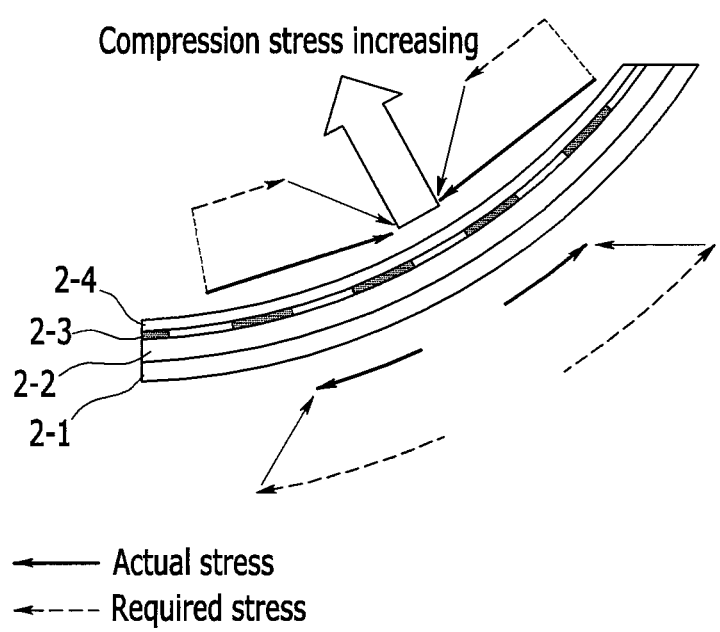
FIG. 8 is a schematic view showing a magnitude and a direction of a stress applied by a folding evaluation jig of a conventional foldable display module.

FIG. 4 is a cross-sectional view of a foldable display device according to one or more exemplary embodiments of the present invention, FIG. 5 is a schematic cross-sectional view of the foldable display device shown in FIG. 4, and FIG. 6 is a perspective view of the foldable display device shown in FIG. 4.

Referring to FIG. 4, in some embodiments, the foldable display device may include a first supporting member 12 and a second supporting member 14 coupled to the first supporting member 12 to be rotated with respect to the first supporting member 12. The first supporting member 12 and the second supporting member 14 are coupled by a hinge axis H to be rotated thereabout. An ultra-elastic sheet 16 is adhered to a first region of the first supporting member 12, and is adhered to a first region (e.g., a coupling region) of the second supporting member 14, and a mechanical bracket 15 is adhered to a second region of the first supporting member 12, and is adhered to a second region (e.g., a non-coupling region) of the second supporting member 14. The mechanical bracket 15 is directly adhered to the first supporting member 12 and to the second supporting member 14, and a display module 20 is adhered to the ultra-elastic sheet 16 and to the mechanical bracket 15 by an adhesive (e.g., an adhesive tape or a pressure sensitive adhesive) 18.

The ultra-elastic sheet 16 may be formed of a metal sheet or INVAR® (INVAR® is a registered trademark of Aperam Alloys Imphy Joint Stock Company), and may have a modulus of elasticity of about 50 GPa to about 80 GPa.

As shown in FIG. 5 and FIG. 6, in some embodiments, the ultra-elastic sheet 16 and the mechanical bracket 15 may be connected to be integrally formed. The ultra-elastic sheet 16 and the mechanical bracket 15 that are integrally formed may be adhered on the entire surface of the display module 20. By adhering the mechanical bracket 15 to the display module 20 along with the ultra-elastic sheet 16, mechanical strength may be improved, such that the display module 20 may be protected from an external impact.

In the present exemplary embodiment, for the display module 20, like the previously described exemplary embodiment, a display panel 21, a touch screen panel 23, and a window layer 25 may be adhered by the pressure sensitive adhesives 22, 24, and 27 to provide a sequentially laminated structure, and the polarization film 26 may be provided between the display panel 21 and the touch screen panel 23.

As described above, according to the foldable display device according to one or more embodiments of the present invention, when folding the display device, the layers of the display module may be prevented from being peeled, or the likelihood thereof may be reduced, and the mechanical strength of the display device may be improved.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

| Description of some of the symbols | |
|---|---|
| 12: first supporting member | 14: second supporting member |
| 15: mechanical bracket | 16: ultra-elastic sheet |
| 18: adhesive tape | 20: display module |
| 21: display panel | 23: touch screen panel |
| 25: window layer | 26: polarization film |
| 22, 24, 27: pressure sensitive adhesive | H: hinge axis |

What is claimed is:

1. A foldable display device comprising:
   a first supporting member;
   a second supporting member coupled to the first supporting member and configured to be rotated with respect to the first supporting member;

an ultra-elastic sheet adhered to a coupling region which connects the first supporting member and the second supporting member;

a mechanical bracket adhered to a non-coupling region except for the coupling region; and a display module adhered to the ultra-elastic sheet and the mechanical bracket, wherein the foldable display device is configured to outwardly expose the display module in a folded configuration, wherein the ultra-elastic sheet and the mechanical bracket are disposed at the same layer and are connected to each other, and wherein a modulus of elasticity of the ultra-elastic sheet is greater than a modulus of elasticity of the mechanical bracket.

2. The foldable display device of claim 1, wherein the ultra-elastic sheet comprises a metal sheet or INVAR®.

3. The foldable display device of claim 2, wherein the ultra-elastic sheet has a modulus of elasticity of about 50 GPa to about 80 GPa.

4. The foldable display device of claim 1, wherein an end of the second supporting member is coupled to an end of the first supporting member by a hinge axis.

5. The foldable display device of claim 1, wherein the display module comprises:
a display panel;
a touch screen panel on the display panel; and
a window layer on the touch screen panel.

6. The foldable display device of claim 5, wherein the display panel comprises:
a flexible display substrate;
a display element layer on the flexible display substrate and comprising a plurality of pixels; and
a thin film encapsulation layer covering the flexible display substrate and the display element layer.

7. The foldable display device of claim 6, wherein the display element layer comprises an organic light emission display element.

8. The foldable display device of claim 5, wherein the window layer comprises polyimide (PI) and/or polyethylene terephthalate (PET).

9. The foldable display device of claim 5, wherein the display module further comprises a polarization film between the display panel and the touch screen panel.

10. The display module of claim 1, wherein the first supporting member, the ultra-elastic sheet, and the display module are stacked along a stacking direction, and wherein the foldable display device is configured to outwardly expose the display module along the stacking direction in the folded configuration.

11. A foldable display device comprising:
a display panel including a bending region and a rigid region;
an ultra-elastic sheet under the display panel and overlapping the bending region; and
a mechanical bracket under the display panel and overlapping the rigid region,
wherein the ultra-elastic sheet and the mechanical bracket are disposed at the same layer and are connected to each other, and
wherein the ultra-elastic sheet is made of a material that is different from a material of the mechanical bracket.

12. The foldable display device of claim 11, wherein the ultra-elastic sheet has a modulus of elasticity of about 50 GPa to about 80 GPa.

13. The foldable display device of claim 12, wherein the modulus of elasticity of the ultra-elastic sheet is greater than a modulus of elasticity of the mechanical bracket.

14. The foldable display device of claim 11, further comprising a supporting member overlapping the rigid region of the display panel.

15. The foldable display device of claim 11, wherein the ultra-elastic sheet is made of a metal sheet or INVAR®.

16. The foldable display device of claim 11, wherein the bending region is disposed between two rigid regions.

17. A foldable display device comprising:
a first supporting member;
a second supporting member coupled to the first supporting member and configured to be rotated with respect to the first supporting member;
an ultra-elastic sheet adhered to the first supporting member and the second supporting member; and
a display module adhered to the ultra-elastic sheet,
wherein the ultra-elastic sheet has a modulus of elasticity of about 50 GPa to about 80 GPa.

18. The foldable display device of claim 17, wherein the modulus of elasticity of the ultra-elastic sheet is greater than a modulus of elasticity of a mechanical bracket adhered to a non-coupling region of the foldable display device.

19. The foldable display device of claim 17, wherein an end of the second supporting member is coupled to an end of the first supporting member by a hinge axis.

* * * * *